United States Patent
Watson

(10) Patent No.: US 7,602,217 B2
(45) Date of Patent: Oct. 13, 2009

(54) LEVEL SHIFTER CIRCUIT WITH PRE-CHARGE/PRE-DISCHARGE

(75) Inventor: Calvin Watson, Austin, TX (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 3 days.

(21) Appl. No.: 11/839,611

(22) Filed: Aug. 16, 2007

(65) Prior Publication Data

US 2009/0045843 A1    Feb. 19, 2009

(51) Int. Cl.
*H03K 19/0175* (2006.01)
*H03K 19/094* (2006.01)
*H03K 19/00* (2006.01)
*H03K 19/096* (2006.01)
*H03K 19/20* (2006.01)

(52) U.S. Cl. .............................. 326/68; 326/63; 326/93; 326/95; 326/113; 327/202

(58) Field of Classification Search ............. 326/80–92, 326/63, 68, 93, 95, 113
See application file for complete search history.

(56) References Cited

U.S. PATENT DOCUMENTS

| | | | |
|---|---|---|---|
| 5,969,542 A | 10/1999 | Maley | |
| 6,351,173 B1 * | 2/2002 | Ovens et al. | 327/333 |
| 6,373,764 B2 * | 4/2002 | Fujioka | 365/205 |
| 6,433,586 B2 * | 8/2002 | Ooishi | 326/93 |
| 6,631,092 B2 * | 10/2003 | Yamasaki | 365/201 |
| 6,735,133 B1 * | 5/2004 | Tsukikawa | 365/201 |
| 6,925,022 B2 * | 8/2005 | Arimoto et al. | 365/222 |
| 6,930,938 B2 * | 8/2005 | Yasuda | 365/201 |
| 6,971,032 B2 * | 11/2005 | Ohie et al. | 713/300 |
| 7,317,335 B2 | 1/2008 | Min | |
| 7,319,630 B2 | 1/2008 | Wang | |
| 2004/0051556 A1 * | 3/2004 | Shimazaki et al. | 326/80 |
| 2006/0158225 A1 * | 7/2006 | Stojanovic et al. | 326/87 |

* cited by examiner

*Primary Examiner*—Vibol Tan
*Assistant Examiner*—Matthew C Tabler
(74) *Attorney, Agent, or Firm*—Meyertons Hood Kivlin Kowert & Goetzel, P.C.; B. Noël Kivlin; Erik A. Heter

(57) ABSTRACT

A level shifter circuit and method of operating therefor. The level shifter circuit is coupled to receive a data signal via an input circuit, wherein the input circuit is in a first voltage domain. The level shifter circuit is also coupled to receive a clock signal from a second voltage domain. On a first portion of the clock cycle, true and complementary output nodes of the level shifter circuit (which are in the second voltage domain) are pulled to a first voltage by activation of respective pull transistors. On a second portion of the clock cycle, one of the true or complementary output nodes is pulled to a second voltage on a second voltage node by enabling the supply to the latch. Data is captured by the keeper, outputting true and complementary versions of the data signal in the second phase of the clock.

20 Claims, 5 Drawing Sheets

LEVEL SHIFTER CIRCUIT WITH PRE-CHARGE/PRE-DISCHARGE

BACKGROUND OF THE INVENTION

1. Field of the Invention

This invention relates to electronic circuits, and more particularly, to level shifter circuits for shifting data from one voltage domain to another.

2. Description of the Related Art

In many electronic devices, data must be conveyed from a first voltage domain (having a first power supply voltage) to a second voltage domain (having a second power supply voltage). Circuits used to accomplish this task are known as level shifters. A level shifter circuit is configured to receive data in the first voltage domain and output the data into the second voltage domain.

FIG. 1 is a schematic diagram of an exemplary level shifter. In the embodiment is shown, data from a first voltage domain having a supply voltage of 3.3 volts is input into the level shifter. Data is output from the level shifter into a voltage domain having a supply voltage of 1.6 volts. In general, level shifters may provide a downshift in voltage (as in the example here), or an upshift in voltage.

Level shifter circuits typically include a pair of cross-coupled inverter circuits that are coupled to an input circuit. In order to cause the transistors of the cross-coupled inverters to change states (when the data similarly changes states), the transistors of the input circuits must provide sufficient drive strength. Providing a sufficient amount of drive strength typically requires the implementation of an input circuit that utilizes devices capable of providing the drive strength necessary to change the state of the keeper circuit.

SUMMARY OF THE INVENTION

A level shifter circuit and method of operating therefor are provided. In one embodiment, a level shifter circuit is coupled to receive a data signal via an input circuit, wherein the input circuit is in a first voltage domain. The level shifter circuit is also coupled to receive a clock signal from a second voltage domain. On a first portion of the clock cycle, true and complementary output nodes of the level shifter circuit (which are in the second voltage domain) are pulled to a first voltage by activation of respective pull transistors. On a second portion of the clock cycle, one of the true or complementary output nodes is pulled to a second voltage on a second voltage node by enabling the supply to the latch. Data is captured by the keeper, outputting true and complementary versions of the data signal in the second phase of the clock.

In one embodiment, the level shifter circuit includes an input circuit and a keeper circuit. The keeper circuit includes a pair of cross-coupled inverter circuits. An output node of the first inverter is coupled to the true output node, and wherein an output node of the second inverter is coupled to the complementary output node. The keeper circuit is configured to hold a data state unless the data state is changed by new data received by the input circuit.

Depending on the specific embodiment, the level shifter circuit may be configured to pre-charge or pre-discharge the output nodes on the first portion of the clock cycle. In embodiments wherein the voltage of the first voltage domain is less than the voltage of the second voltage domain, both the true and complementary nodes are pre-charged to the voltage of the second (higher) voltage domain on a low portion of the clock cycle. On a high portion of the clock cycle, one of the true or complementary nodes is pulled down to the voltage of the first voltage domain, wherein the voltage of the first voltage domain is an intermediate voltage between the voltage of the second voltage domain and a reference voltage. The pull-down during the high portion of the clock cycle may cause the keeper to change states, depending on the state of the input data signal (e.g. if the input data signal is a logic low and the true output node is a logic high prior to inputting the data signal, the state of the true output node, and thus the keeper circuit, will change to a logic low on the high portion of the clock signal).

In another embodiment in which the voltage of the first voltage domain is greater than the voltage of the second voltage domain, both the true and complementary output nodes are pre-discharged during a high portion of a complementary (i.e. inverted) clock signal. The true and complementary outputs are pre-discharged by pulling them down to a reference voltage. During the low portion of the complementary clock cycle, one of the true or complementary outputs is pulled up to a second voltage, which is an intermediate voltage between the reference voltage and the supply voltage of the first voltage domain. The pull-up during the low portion of the complementary clock cycle will cause one of the true or complementary outputs, depending on the input data, to be pulled up to the second voltage, which is the supply voltage of the second voltage domain. With the use of a clock signal, the level shifter circuit functions as a latch.

In various embodiments, the input circuit is configured to receive true and complementary values of the input data signal via pass transistors. Since the various embodiments of the circuit are configured to either precharge or pre-discharge the output nodes (which are also input nodes to the cross-coupled inverters of the keeper circuit), the pass transistors are not required to provide a drive strength sufficient to cause the state of the keeper circuit to change. Thus, these devices may be relatively small, thereby conserving area.

BRIEF DESCRIPTION OF THE DRAWINGS

Other aspects of the invention will become apparent upon reading the following detailed description and upon reference to the accompanying drawings in which.

Figure 1:
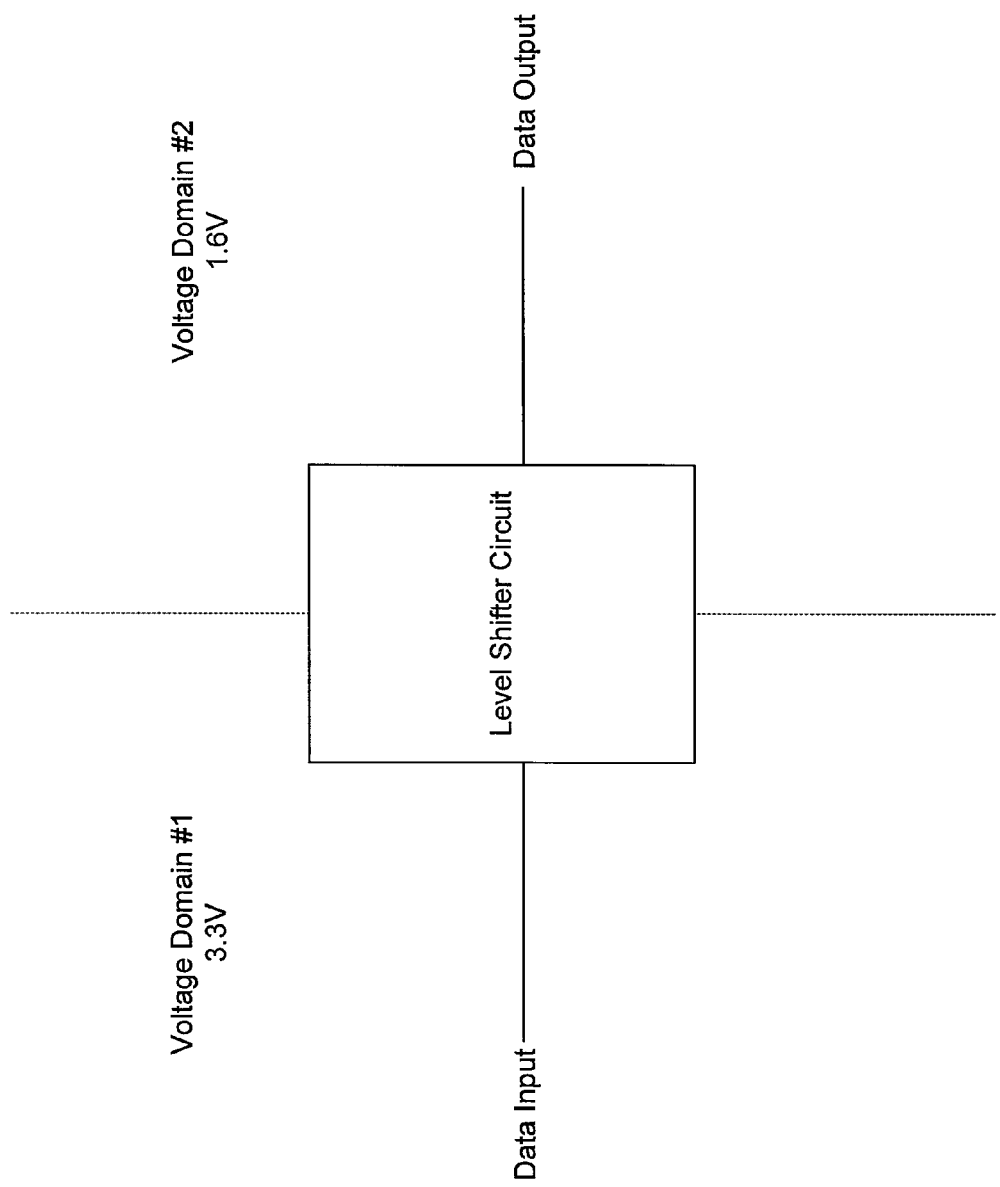
FIG. 1 (prior art) is a diagram of an exemplary level shifter.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Figure 2:
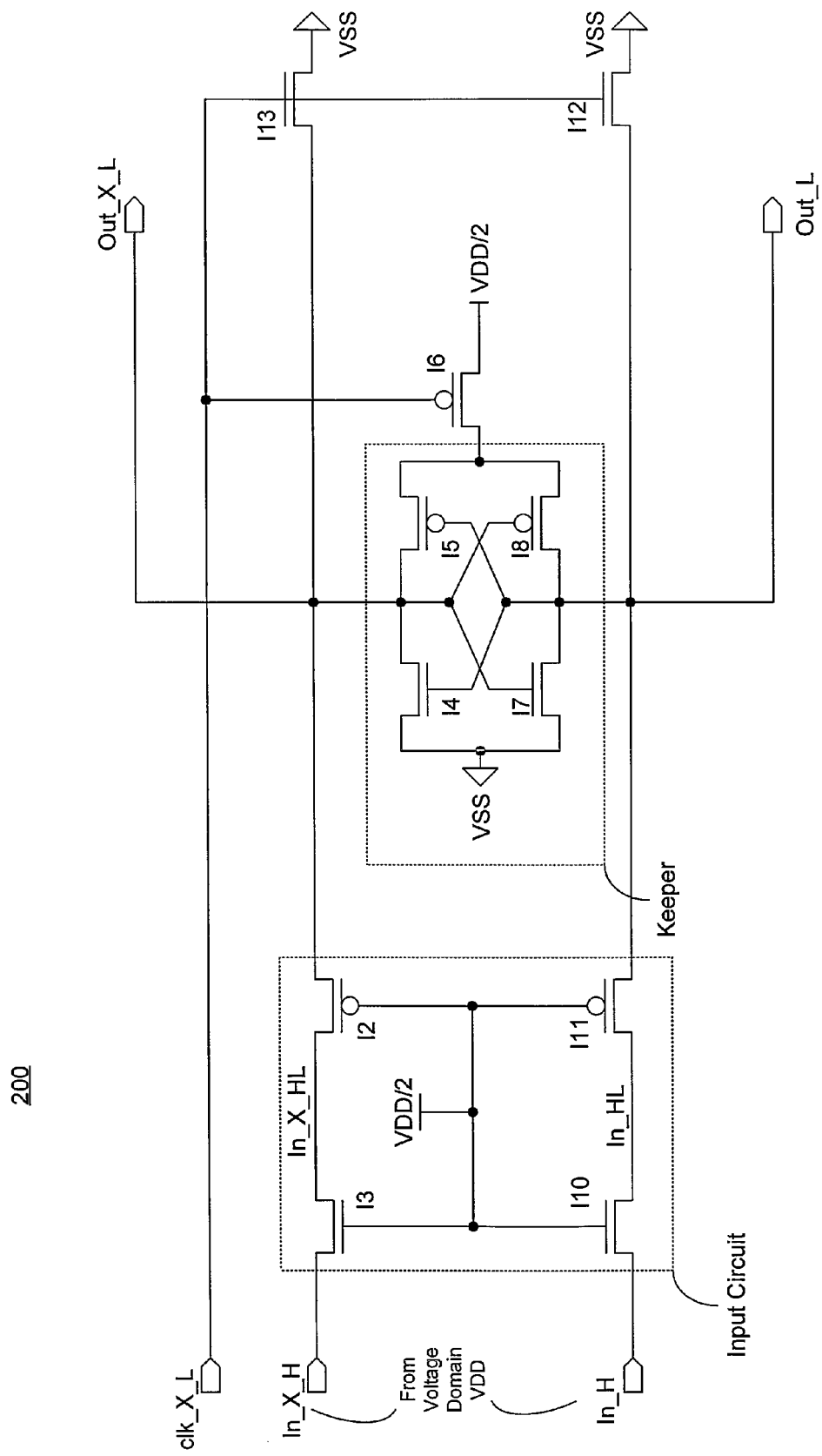
FIG. 2 is a schematic diagram of one embodiment of a level shifter having a pre-discharge circuit.

Turning now to FIG. 2, a schematic diagram of one embodiment of a level shifter having a pre-discharge circuit is shown. In the embodiment shown, level shifter circuit 200 is configured to transfer data from a higher voltage domain to a lower voltage domain. That is, the power supply voltage for the higher voltage domain is greater than that of the lower voltage domain.

Level shifter circuit 200 includes an input circuit comprising transistors I2, I3, I10, and I11. Input terminal In_H and its complement, In_X_H are coupled to the input circuit. The input terminals are coupled to receive a differential input signal from a voltage domain having a higher voltage (e.g., VDD), which are then level shifted to the voltage domain of VDD/2. Transistors I10 and I11 allow the input signal In_H to pass, while transistors I2 and I3 allow the complementary input signal In_X_H to pass. The transistors of the input circuit are arranged in a cascade configuration in order to latch the input data through to the output nodes (and thus to the keeper circuit). The transistors may be turned on or off depending on the voltages of the input signals (i.e. the states of the data) and their respective threshold voltages, as well as the voltages placed on the output nodes during the pre-discharge operation.

Level shifter circuit 200 also includes a keeper circuit. The keeper circuit includes transistors I4, I5, I7 and I8 coupled together in a cross-coupled inverter configuration. Transistors I4 and I5 make up a first inverter, while transistors I7 and I8 make up a second inverter. The output of the first inverter is also coupled to an output node, Out_X_L, and is also coupled to the input of the second inverter. Similarly, the output of the second inverter is coupled to the other output node, Out_L, and is further coupled to the input of the first inverter. Furthermore, the input In_H is coupled to the input of the first inverter, while the input In_X_H is coupled to the input of the second inverter.

In this particular embodiment, level shifter circuit 200 includes a pull-up transistor I6 coupled to the keeper circuit. Level shifter circuit 200 also includes a pair of pull-down transistors I12 and I13, which are coupled to output nodes Out_L and Out_X_L, respectively. The pull-down transistors and the pull up transistor are configured to be activated during opposite phases of a clock cycle. In this particular case, the clock signal, received by level shifter circuit 200, clk_X_L, is a complement of a clock signal used in the lower voltage domain.

During operation of level shifter circuit 200, a logic high on the clk_X_L input will activate both pull-down transistors I12 and I13, which are NMOS devices. When these devices are activated, both output nodes of level shifter circuit 200 are pulled down to a reference voltage, VSS in this case. Pulling down the output nodes thus results in a discharge of these nodes. This pre-discharge may be performed before data is input on the input nodes.

After the pre-discharge operation is complete, data may be input into the input nodes. More particularly, a data signal may be input to the In_H input while a complement of the data signal may be input into the In_X_H input. When the clk_X_L signal falls low, transistors I12 and I13 will be de-activated, while transistor I6 will be activated. When activated, I6 will pull up one of the output nodes up to VDD/2, depending on the state of the input data. If In_H is a logic low, Out_X_L will be pulled up to VDD/2 (which is equivalent to a logic high in the voltage domain of the output node). Out_L will be pulled up to VDD/2 if In_X_H is a logic low. Thus, the input data is latched through level shifter circuit 200.

The combination of pre-discharging the output nodes on the high portion of the input clock cycle and pulling up one of the output nodes on the low portion of the clock cycle may help the "flip" the state of the keeper circuit if the input data state is different than the currently stored data state. Since the pre-discharge and pull-up operations are capable of causing the state of the keeper circuit to change, input circuit transistors I2, I3, I10, and I11 may be kept relatively small, as they do not need to provide sufficient drive strength to override the state of the keeper circuit.

Figure 3:
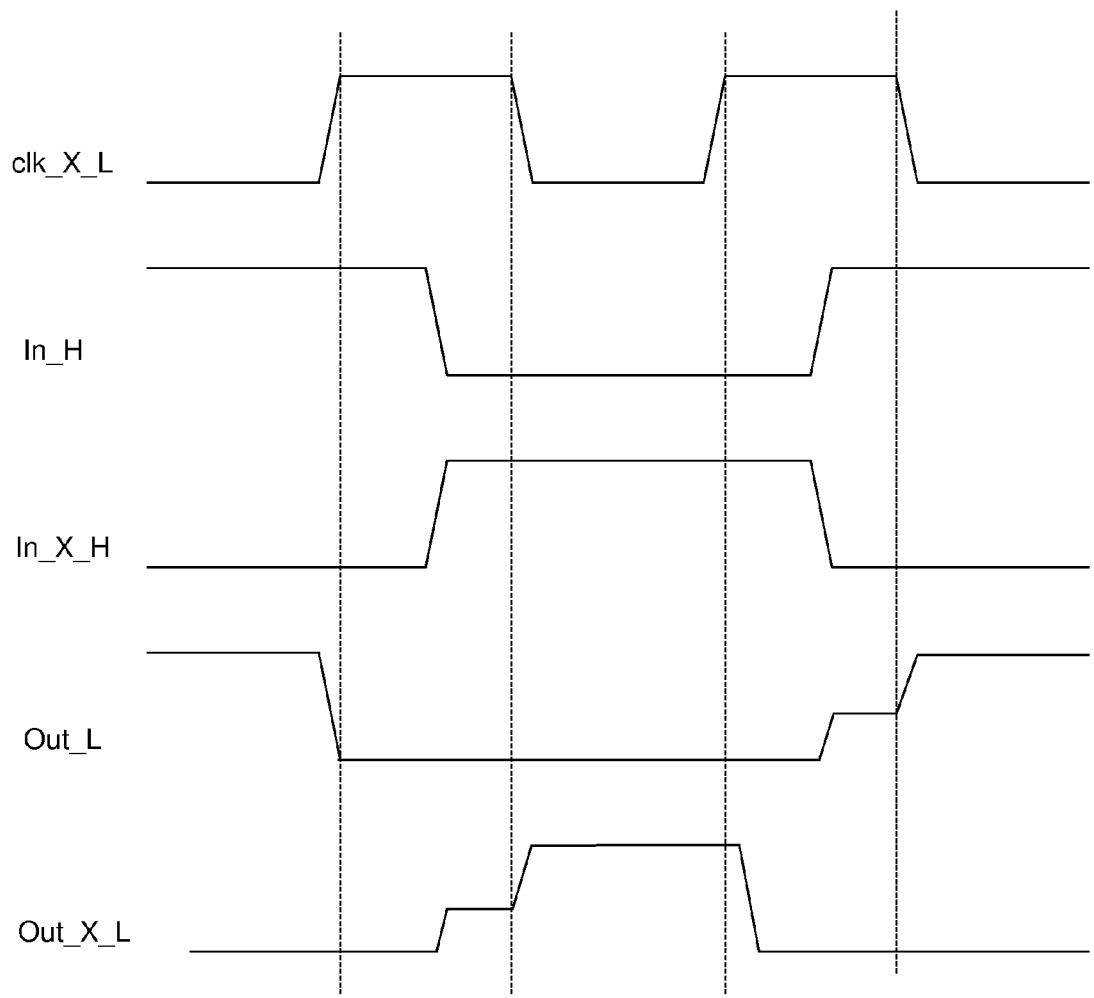
FIG. 3 is a timing diagram illustrating the operation of the circuit shown in FIG. 2.

FIG. 3 is a timing diagram illustrating the operation of the circuit shown in FIG. 2. In the example shown, the In_L input is initially a logic high, while its complement is initially a logic low. Similarly, the Out_L input is initially a logic high, while its complement is initially a logic low. When the clk_X_L signal transitions to a logic high, the Out_L output is pulled down (i.e. discharged) while the Out_X_L output remains a logic low. After the output nodes are pulled down, new data, which represents a change of state, is input into level shifter circuit 200, as In_H falls low while its complement transitions to a logic high. Out_L remains low, but Out_X_L will attempt to go high, as there may be some contention between the input node and the output node. Once clk_X_L falls low again, Out_X_L will fully transition to a logic high, and thus the newly input data is latched to the outputs.

A similar process occurs in the example shown on the next clock cycle. When the clk_X_L transitions high again, both output nodes are discharged to a logic low level. New data, in the form of a logic high for In_H and a logic low for its complement is then input into the level shifter circuit, while clk_X_L is high. When the clk_X_L signal falls low again, Out_L is correspondingly pulled up to a logic high state while Out_X_L remains low after having been discharged to that level.

Figure 4:
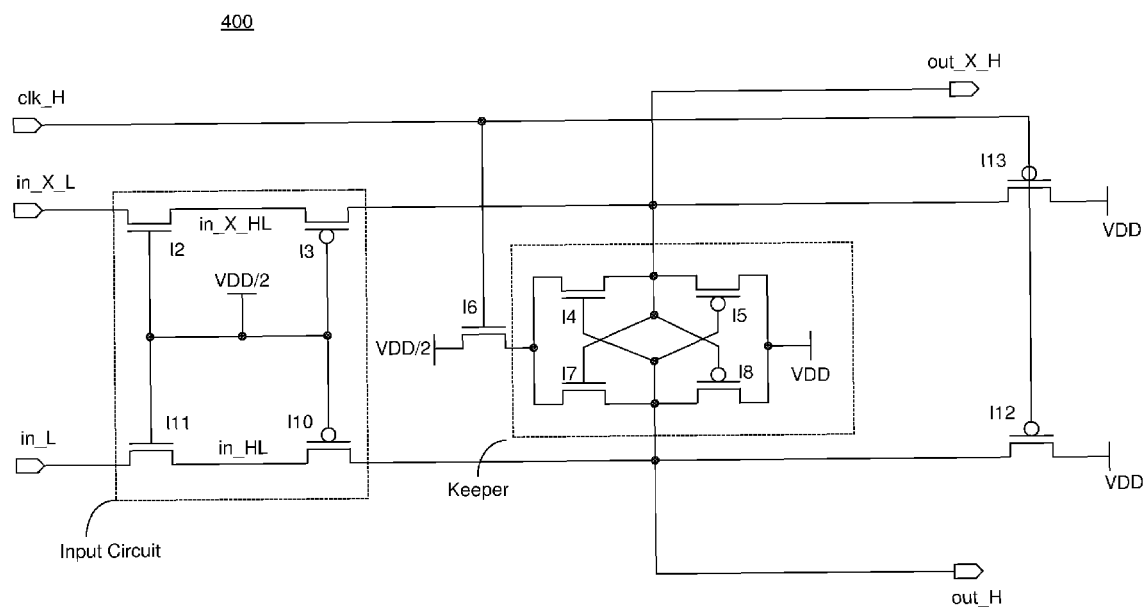
FIG. 4 is a schematic diagram of an embodiment of a level shifter having a pre-charge circuit.

FIG. 4 is a schematic diagram of an embodiment of a level shifter having a pre-charge circuit. In this particular embodiment, level shifter circuit 400 is configured to transfer data from a lower voltage domain to a higher voltage domain. Furthermore, in this particular embodiment, level shifter circuit 400 is configured to precharge the output nodes, instead of pre-discharging them as is done with the circuit illustrated in FIG. 2.

Level shifter circuit 400 is arranged in a manner similar to the circuit of FIG. 2, having both an input circuit and a keeper circuit. However, in level shifter circuit 400, transistor I12 and I13 are pull-up transistors, while pull-down transistor I6 is coupled to the NMOS devices of the keeper circuit instead of the PMOS devices. Furthermore, transistor I6 is configured to, when activated, to pull one of the inputs of the cross-coupled inverters down to VDD/2 through a corresponding activated NMOS device. The PMOS devices of the keeper circuit are coupled to VDD, which causes one of the input nodes to be pulled up when a corresponding PMOS device is activated.

The pull-up transistors and pull-down transistor are activated on opposite phases of a clock cycle provided from the higher voltage domain. When clk_H is in a low state, transistors I12 and I13 will be activated, thereby pulling up the output nodes out_H and out_X_H of level shifter circuit 400. When clk_H is in a high state, transistor I12 and I13 will be deactivated, while transistor I6 is activated. When transistor I6 is activated, one of the inputs nodes of the cross-coupled inverters will be pulled down to VDD/2, depending on which one of transistor I4 or I7 is activated.

Figure 5:
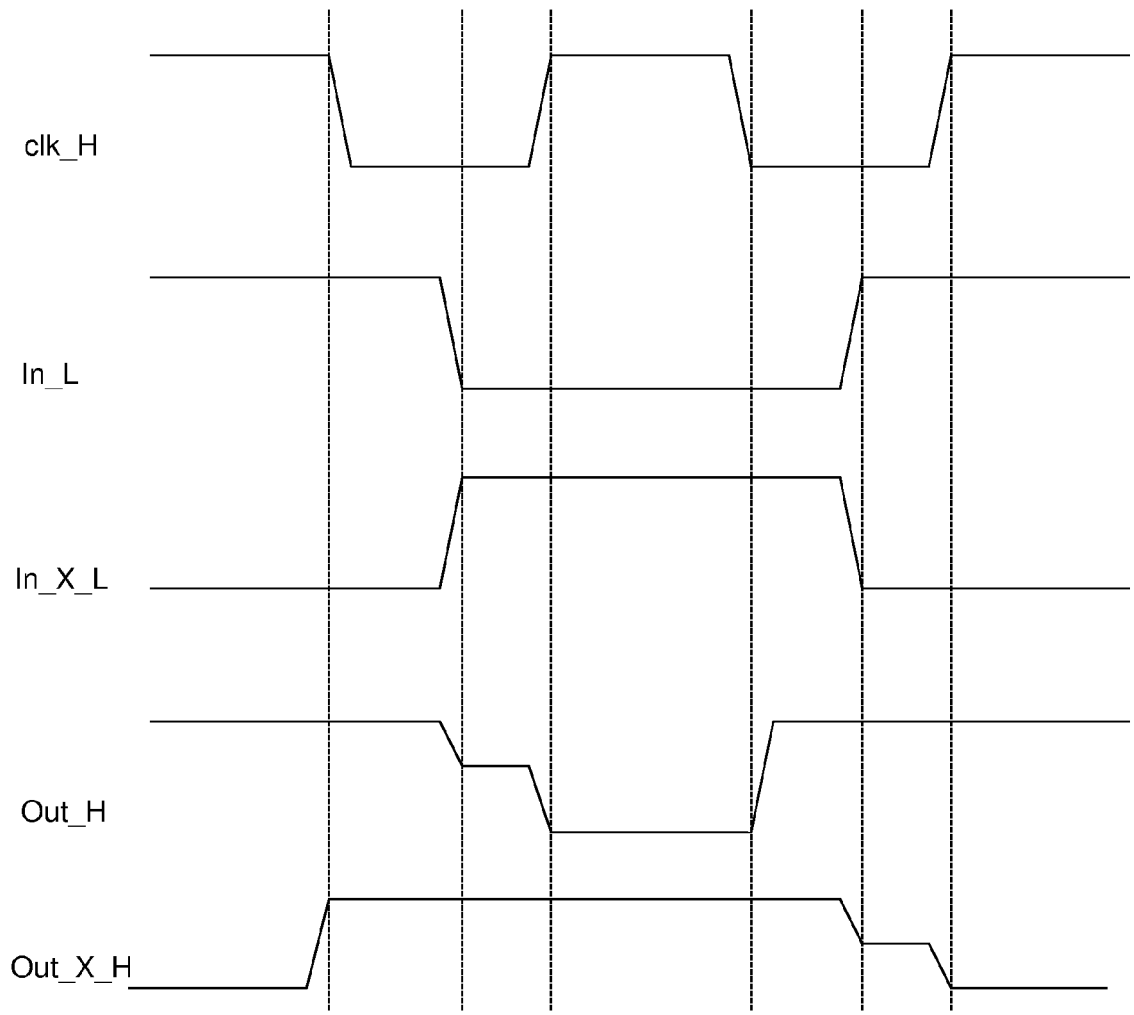
FIG. 5 is a timing diagram illustrating the operation of the circuit shown in FIG. 4.

FIG. 5 is a timing diagram illustrating the operation of the circuit shown in FIG. 4. Initially in the example shown, clk_H is in the high portion of its cycle, while In_L is a logic high and its complement is a logic low. When clk_H falls low, Out_X_H is pulled high, while Out_H remains high. After clk_H falls low and Out_X_H is pulled high, new data is input into the level shifter in the form of In_L being pulled down to a logic low in the higher voltage domain, with its complement transitioning to a logic high. When clk_H transitions high again, Out_H completes a transition to a logic low, while Out_X_H remains at a logic high after the precharge.

The data states of the output nodes change again on the next cycle of operation due to changes in the input signals, as In_L transitions high (and thus results in Out_H transitioning high) while In_X_H falls low (with a corresponding fall of Out_X_H to a logic low), in accordance with the described operation of level shifter circuit 400.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A method for operating a level shifter circuit, the method comprising:
   providing a data signal to an input circuit of the level shifter circuit, wherein the data signal is provided from a first voltage domain operating at a first voltage, wherein the data signal is provided to a true input node and a complementary input node of the input circuit, the input circuit having first and second transistors coupled to convey a true value of the data signal, and third and fourth transistors coupled to convey a complementary value of the data signal, wherein gate terminals of each of the first, second, third, and fourth transistors are coupled to an intermediate voltage node;
   on a first portion of a clock cycle, coupling each of a true output node and a complementary output node of the level shifter circuit to a pull voltage node in order to pull the true and complementary output nodes to a pull voltage present on the pull voltage node;
   on a second portion of the clock cycle, coupling one of the true or complementary output nodes to the intermediate voltage node in order to pull the one of the true or complementary output nodes to an intermediate voltage, wherein the intermediate voltage is greater than a reference voltage; and
   outputting the true and complementary values of the data signal into the second voltage domain during the second portion of the clock cycle.

2. The method as recited in claim 1, wherein coupling each of the true and complementary output nodes to the pull voltage node comprises pre-charging the true and complementary output nodes, wherein the pull voltage is the second voltage.

3. The method as recited in claim 2, wherein the first second voltage is greater than the first voltage, wherein the first voltage is the intermediate voltage.

4. The method as recited in claim 1, wherein coupling each of the true and complementary output nodes to the pull voltage node comprises discharging the true and complementary output nodes to a reference voltage, wherein the reference voltage is the pull voltage.

5. The method as recited in claim 4, wherein the second voltage is less than the first voltage, and wherein the second voltage is the intermediate voltage.

6. The method as recited in claim 1, wherein the level shifter circuit includes a keeper circuit comprising a first and second cross-coupled inverters, wherein an output node of the first inverter is coupled to the true output node, and wherein an output node of the second inverter is coupled to the complementary output node.

7. The method as recited in claim 1, wherein the first portion of the clock cycle is a high portion of a complementary clock signal provided from the second voltage domain, and wherein the second portion of the clock cycle is a low portion of the complementary clock signal.

8. The method as recited in claim 1, wherein the first portion of the clock cycle is a low portion of a clock signal provided from the second voltage domain, and wherein the second portion of the clock cycle is a high portion of the clock signal.

9. A level shifter circuit comprising:
   an input circuit coupled to receive a data signal from a first voltage domain operating at a first voltage, wherein the input circuit includes first and second transistors coupled to convey a true value of the data signal, and third and fourth transistors coupled to convey a complementary value of the data signal, and wherein gate terminals of each of the first, second, third, and fourth transistors are coupled to an intermediate voltage;
   a clock input coupled to receive a clock signal from a second voltage domain operating at a second voltage;
   a first pull transistor coupled to a true output node and a second pull transistor coupled to a complementary output node, the true and complementary output nodes being in the second voltage domain, wherein the first and second pull transistors are configured to be activated on a first portion of a cycle of the clock signal, and wherein activation of the first and second pull transistors causes the true and complementary output nodes to be pulled to a pull voltage on a pull voltage node;
   a keeper circuit coupled to the output node and the complementary output node; and
   third pull transistor coupled to the keeper circuit, wherein the third pull transistor is configured to be activated on a second portion of the cycle of the clock signal, wherein activation of the third pull transistor causes, depending on the data signal, one of the true or complementary output nodes to be pulled to the intermediate voltage, the intermediate voltage being greater than a reference voltage, and further causes the true and complementary values of the data signal to be output into the second voltage domain.

10. The level shifter circuit as recited in claim 9, wherein each of the first and second pull transistors are precharge transistors, and wherein activation of the first and second transistors causes the true and complementary output nodes to be pre-charged to the second voltage, wherein the second voltage is the pull voltage.

11. The level shifter circuit as recited in claim 10, wherein the second voltage is greater than the first voltage, wherein the first voltage is the intermediate voltage.

12. The level shifter as recited in claim 9, wherein each of the first and second pull transistors are pre-discharge transistors, and wherein activation of the first and second transistors causes the true and complementary output nodes to be pre-discharged to the reference voltage, wherein the pull voltage is the reference voltage.

13. The level shifter as recited in claim 12, wherein the second voltage is less than the first voltage, and wherein the second voltage is the intermediate voltage.

14. The level shifter as recited in claim 9, wherein the keeper circuit includes first and second cross-coupled inverters, wherein an output node of the first inverter is coupled to the true output node, and wherein an output node of the second inverter is coupled to the complementary output node.

15. The level shifter as recited in claim 14, wherein an input node of the second inverter is coupled to receive the true value of the data signal, and wherein an input node of the first inverter is coupled to receive the complementary value of the data signal.

16. The level shifter as recited in claim 9, wherein the first portion of the clock cycle is a high portion of a complementary clock signal provided from the second voltage domain, and wherein the second portion of the clock cycle is a low portion of the complementary clock signal.

17. The level shifter as recited in claim 9, wherein the first portion of the clock cycle is a low portion of a clock signal provided from the second voltage domain, and wherein the second portion of the clock cycle is a high portion of the clock signal.

18. A level shifter circuit comprising:
   first means for receiving, from a first voltage domain operating at a first voltage, a differential data signal having a true value and a complementary value;
   second means for storing a state of the differential data signal, said second means having a true node and a complementary node, said true and complementary nodes being coupled to provide the differential data signal to a second voltage domain operating at a second voltage;
   third means for pulling said true node and said complementary node to a pull voltage during a first portion of a clock cycle;
   fourth means for pulling one of said true node and said complementary node to an intermediate voltage depending on a state of the differential data signal during a second portion of the clock cycle; and
   fifth means for outputting the differential data signal into the second voltage domain during the second portion of the clock cycle.

19. The level shifter circuit as recited in claim 18, wherein pulling said true node and said complementary node to a pull voltage during a first portion of a clock cycle comprises pre-charging said true node and said complementary node.

20. The level shifter circuit as recited in claim 18, wherein pulling said true node and said complementary node to a pull voltage during a first portion of a clock cycle comprises pre-discharging said true node and said complementary node.

* * * * *

UNITED STATES PATENT AND TRADEMARK OFFICE
CERTIFICATE OF CORRECTION

PATENT NO. : 7,602,217 B2
APPLICATION NO. : 11/839611
DATED : October 13, 2009
INVENTOR(S) : Calvin Watson It is certified that error appears in the above-identified patent and that said Letters Patent is hereby corrected as shown below:

Claim 3, col. 5, line 51, please delete "first" after the.

Signed and Sealed this

First Day of December, 2009

David J. Kappos
*Director of the United States Patent and Trademark Office*